United States Patent
Kuniyasu

(10) Patent No.: US 6,541,291 B2
(45) Date of Patent: Apr. 1, 2003

(54) SEMICONDUCTOR LIGHT EMITTING DEVICE IN WHICH NEAR-EDGE PORTION IS FILLED WITH DOPED REGROWTH LAYER, AND DOPANT TO REGROWTH LAYER IS DIFFUSED INTO NEAR-EDGE REGION OF ACTIVE LAYER

(75) Inventor: Toshiaki Kuniyasu, Kaisei-machi (JP)

(73) Assignee: Fuji Photo Film Co., Inc., Kanagawa-Ken (JP)

( * ) Notice: Subject to any disclaimer, the term of this patent is extended or adjusted under 35 U.S.C. 154(b) by 0 days.

(21) Appl. No.: 09/934,571

(22) Filed: Aug. 23, 2001

(65) Prior Publication Data

US 2002/0050598 A1 May 2, 2002

(30) Foreign Application Priority Data

Aug. 24, 2000 (JP) .................... 2000-253518
Mar. 22, 2001 (JP) .................... 2001-083185

(51) Int. Cl.⁷ .................. H01L 21/00; H01L 33/00; H01S 5/00
(52) U.S. Cl. .................. 438/22; 438/24; 438/29; 257/79; 257/83; 257/88; 372/45; 372/46; 372/49
(58) Field of Search .................. 438/22, 24, 29; 257/88, 79, 83, 95; 372/45, 46, 49

(56) References Cited

U.S. PATENT DOCUMENTS

| 4,371,966 A | * | 2/1983 | Scifres et al. ........... 372/45 |
| 4,819,245 A | * | 4/1989 | Morimoto et al. ........... 372/48 |
| 5,020,068 A | * | 5/1991 | Isshiki ........... 372/46 |
| 5,145,792 A | * | 9/1992 | Hirata ........... 438/36 |
| 5,345,460 A | * | 9/1994 | Takiguchi et al. ........... 372/43 |
| 5,838,028 A | * | 11/1998 | Horie et al. ........... 257/183 |
| 5,987,048 A | * | 11/1999 | Ishikawa et al. ........... 372/46 |
| 6,009,112 A | * | 12/1999 | Uchida ........... 372/46 |
| 6,396,863 B1 | * | 5/2002 | Fukunaga ........... 372/46 |
| 6,459,714 B1 | * | 10/2002 | Narui et al. ........... 372/48 |
| 2002/0037022 A1 | * | 3/2002 | Fukagai ........... 372/46 |

FOREIGN PATENT DOCUMENTS

JP  2000-31596  * 1/2000 ............. H01S/5/30

* cited by examiner

Primary Examiner—Eddie Lee
Assistant Examiner—José R. Diaz
(74) Attorney, Agent, or Firm—Sughrue Mion, PLLC

(57) ABSTRACT

In a process for producing a semiconductor light emitting device, first, a lamination including an active zone, cladding layers, and a current confinement layer is formed. Then, a near-edge portion of the lamination having a stripe width is removed so as to produce a first space, and a second near-edge portion located under the first space and a stripe portion of the lamination being located inside the first space and having the stripe width are concurrently removed so that a second space is produced, and cross sections of the active layer and the current confinement layer are exposed in the second space. Finally, the first and second spaces are filled with a regrowth layer so that a dopant to the regrowth layer is diffused into a near-edge region of the remaining portion of the active layer.

1 Claim, 4 Drawing Sheets

SEMICONDUCTOR LIGHT EMITTING DEVICE IN WHICH NEAR-EDGE PORTION IS FILLED WITH DOPED REGROWTH LAYER, AND DOPANT TO REGROWTH LAYER IS DIFFUSED INTO NEAR-EDGE REGION OF ACTIVE LAYER

BACKGROUND OF THE INVENTION

1. Field of the Invention

The present invention relates to a semiconductor light emitting device having an end-facet window structure which prevents carrier recombination at a light-exit end facet. The present invention also relates to a process for producing such a semiconductor light emitting device.

2. Description of the Related Art

In conventional semiconductor light emitting devices, when optical output power is increased, currents generated by optical absorption in vicinities of end facets generate heat, i.e., raise the temperature at the end facets. In addition, the raised temperature reduces the semiconductor bandgaps at the end facets, and therefore the optical absorption is further enhanced. That is, a vicious cycle is formed, and the end facet is damaged. This damage is the so-called catastrophic optical mirror damage (COMD). Thus, the maximum optical output power is limited due to the COMD. In order to overcome the above problem, various techniques have been proposed for the window structures which prevent the light absorption in the vicinities of end facets by increasing the semiconductor bandgaps in the vicinities of the end facets.

For example, Japanese Unexamined Patent Publication No. 2000-31596 discloses a semiconductor laser device and a process for producing a semiconductor laser device. In the process, a window structure is realized by removing a portion of an upper cladding layer in a vicinity of light-exit end facet to a depth near a quantum-well active layer by etching, and forming a regrowth layer doped with the same dopant as that of an upper cladding layer so that the dopant diffuses into the quantum-well active layer, and crystal mixture occurs in the quantum-well active layer.

Since, in the above process, the dopant is diffused into the quantum-well active layer through the cladding layer and an optical waveguide layer during the formation of the regrowth layer, the diffusion depth of the dopant and the degree of the crystal mixture vary due to irregularity of thermal diffusion occurring during the formation of the regrowth layer, and therefore the window structure has poor reproducibility. Thus, it is difficult to produce, at a high yield rate, the above semiconductor laser device so that the semiconductor laser device is reliable in a high output power operation. In addition, in the above process, three semiconductor-layer growing steps and two dry etching steps are required to be performed until a semiconductor laser chip is completed. That is, the manufacturing process is complicated, and the manufacturing cost is high.

SUMMARY OF THE INVENTION

An object of the present invention is to provide a semiconductor light emitting device which is reliable in a high output power operation.

Another object of the present invention is to provide a process which can produce a semiconductor light emitting device being reliable in a high output power operation, through a small number of manufacturing steps with high reproducibility.

(1) According to the first aspect of the present invention, there is provided a semiconductor light emitting device comprising: a layered structure and a regrowth layer formed over the layered structure. The layered structure includes a lower cladding layer of a first conductive type, an active zone including an active layer, an upper cladding layer of a second conductive type, and a current confinement layer, which are formed on a substrate in this order. In the layered structure, a groove having a depth corresponding to a bottom of said current confinement layer or a lower elevation is formed for realizing a current injection window, and at least one space is formed between at least one near-edge region of the active zone and at least one end facet. The regrowth layer is doped with a dopant which makes the regrowth layer the second conductive type, and formed over the layered structure so that the groove and the at least one space in the layered structure are filled with the regrowth layer, and the dopant is diffused into at least one near-edge region of the active layer.

The first conductive type is different in the polarity of carriers from the second conductive type. That is, when the first conductive type is an n type, and the second conductive type is a p type.

In the semiconductor light emitting device according to the first aspect of the present invention, at least one space is produced between at least one end facet and the at least one near-edge region of the active zone, and is filled with the regrowth layer so that the dopant with which the regrowth layer is doped is diffused into the at least one near-edge region of the active layer. Therefore, crystal mixture occurs in the at least one near-edge region of the active layer, and the energy gap in the at least one near-edge region of the active layer is increased. Thus, the light absorption in the at least one near-edge region of the active layer is reduced. In particular, even when the output power is increased, and the temperature rises, the light absorption in the at least one near-edge region of the active layer can be reduced. Therefore, it is possible to obtain a semiconductor light emitting device which is reliable even in a high output power operation.

Preferably, the semiconductor light emitting device according to the first aspect of the present invention may also have one or any possible combination of the following additional features (i) to (iv).

(i) A first partial thickness of the layered structure corresponding to the depth of the groove has such composition that the first partial thickness of the layered structure can be etched off by wet etching concurrently with the active layer and a second partial thickness of the layered structure above the active layer.

When the semiconductor light emitting device according to the first aspect of the present invention has the above additional feature (i), and the at least one space between the at least one end facet and the at least one near-edge region of the active layer is produced by forming a lamination of the lower cladding layer, the active zone, the upper cladding layer, and the current confinement layer on the substrate, and etching off at least one near-edge portion of the lamination having a depth corresponding to the bottom of the active layer or a lower elevation, and the groove is produced by etching off a stripe portion of the lamination being located inside the at least one space and having the depth corresponding to the bottom of the current confinement layer or a lower elevation, the etching-off operations for producing the at least one space and the groove can be performed concurrently by an identical lithography process or a self alignment process. Therefore, the number of manufacturing steps can be reduced.

(ii) The substrate is made of GaAs, the lower cladding layer and the upper cladding layer are made of InGaP or AlGaAs, the active layer is made of $In_xGa_{1-x}As_{1-y}P_y$ ($0 \leq x \leq 0.4$, $0 \leq y \leq 0.1$), and the current confinement layer is made of InGaP of the first conductive type. The active zone further includes a lower optical waveguide layer made of $In_{x3}Ga_{1-x3}As_{1-y3}P_{y3}$ ($x3=0.49y3$, $0 \leq x3 \leq 0.3$) of an intrinsic type or the first conductive type and formed under the active layer, and an upper optical waveguide layer made of $In_{x3}Ga_{1-x3}As_{1-y3}P_{y3}$ ($x3=0.49y3$, $0 \leq x3 \leq 0.3$) of an intrinsic type or the second conductive type and formed above the active layer. The layered structure further includes a buffer layer made of GaAs and formed between the substrate and the lower cladding layer, and an etching stop layer made of GaAs and formed under the current confinement layer. The lower optical waveguide layer may be arranged immediately under the active layer, and the upper optical waveguide layer may be arranged immediately above the active layer.

In addition, the InGaP material is a semiconductor material containing at least indium, gallium, and phosphor as components, and the AlGaAs material is a semiconductor material containing at least aluminum, gallium, and arsenic as components. Further, preferably, the compositions of the lower and upper cladding layers are such that the lower and upper cladding layers lattice-match with the GaAs substrate. In particular, it is preferable that the composition of the InGaP material is $In_{0.49}Ga_{0.51}P$, and the composition of the AlGaAs material is $Al_{0.5}Ga_{0.5}As$.

(iii) The at least one space has an approximately identical width with a width of the groove, and is located adjacent to the groove.

(iv) The second conductive type is a p type, to and the dopant is Zn. In this case, the bandgap in the vicinity of the end facet can be satisfactorily increased. Therefore, the light absorption in the vicinity of the end facet can be reduced, and high reliability can be maintained even in a high output power operation.

(2) According to the second aspect of the present invention, there is provided a process for producing a semiconductor light emitting device, comprising the steps of: (a) forming a substrate; (b) forming above the substrate a lower cladding layer of a first conductive type; (c) forming above the lower cladding layer an active zone including an active layer; (d) forming above the active zone an upper cladding layer of a second conductive type; (e) forming a current confinement layer above the upper cladding layer, and obtaining a lamination of the lower cladding layer, the active layer, the upper cladding layer, and the current confinement layer; (f) removing at least one first near-edge portion of the lamination being located near at least one of two opposite end facets and having a first depth and a width corresponding to a stripe width so as to produce at least one first space, by etching the lamination with a first mask which has an opening corresponding to the first near-edge portion; (g) removing at least one second near-edge portion of the lamination being located near the at least one of the two opposite end facets and having the stripe width and a second depth corresponding to the bottom of the active layer or a lower elevation, and a stripe portion of the lamination being located inside the at least one first space and having the stripe width and a third depth corresponding to the bottom of the current confinement layer or a lower elevation, so as to produce a second space, by etching the lamination with a second mask which has a stripe opening having a width corresponding to the stripe width and extending from one to the other of the two opposite end facets; and (h) forming a regrowth layer so as to fill the at least one first space and the second space.

The above first width corresponds to a width of a current injection region.

According to the second aspect of the present invention, in the step (f), a first partial thickness of the near-edge portion of the lamination (i.e., the at least one first near-edge portion of the lamination) having the width corresponding to the stripe width is removed by etching. Thereafter, in the step (g), a second partial thickness of the near-edge portion of the lamination (i.e., the at least one second near-edge portion of the lamination) and having the stripe width is removed by using a mask which has an opening having the stripe width so that at least the full thickness of a cross section of the active layer is exposed, and at the same time, a stripe portion of the lamination being located inside the at least one first space (produced in step (f)) and having the stripe width is removed by using the same mask so that at least the full thickness of a cross section of the current confinement layer is exposed. Thus, the formation of the stripe groove for the internal stripe structure and the removal of the near-edge portion of the active zone can be concurrently achieved by using the same mask. In other words, the conventional manufacturing process of forming the end-facet window structure and the conventional manufacturing process of forming the internal stripe structure can be substituted by a common step of lithography and etching and a common step of forming a regrowth layer, although each of the above conventional manufacturing processes includes a step of forming a step of lithography and etching and a step of forming a regrowth layer. Thus, the total manufacturing process can be simplified by the second aspect of the present invention.

In addition, since the at least one near-edge space for the end-facet window structure and the groove for the internal stripe structure are formed by one lithography process, the at least one near-edge space produced by the removal of the at least one near-edge portion is well aligned with the stripe groove without any provision for realizing the alignment, and the reproducibility in the formation of the end-facet window structure and the groove for the internal stripe structure is high.

Further, since the near-edge portion of the active zone is removed, and is thereafter filled with the regrowth layer, the dopant of the second conductive type in the regrowth layer can be diffused into the at least one near-edge portion of the active layer with high reliability and reproducibility during the formation of the regrowth layer.

DESCRIPTION OF PREFERRED EMBODIMENTS

Embodiments of the present invention are explained in detail below with reference to drawings.

Embodiment of Semiconductor Laser Device

A process for producing a semiconductor laser device as an embodiment of the present invention is explained below. FIGS. 1A to 2B are perspective views of representative stages in a process for producing the semiconductor laser device as the embodiment of the present invention, and FIG. 2C is a cross-sectional view of the final stage in the process for producing the semiconductor laser device. Although, in practice, a plurality of semiconductor laser devices are concurrently manufactured on a wafer of a substrate, and arranged side by side, a construction in a stage corresponding to only one semiconductor laser device is indicated in each of FIGS. 1A to 2C for the sake of simplicity of illustration and better understanding.

Figure 1A:
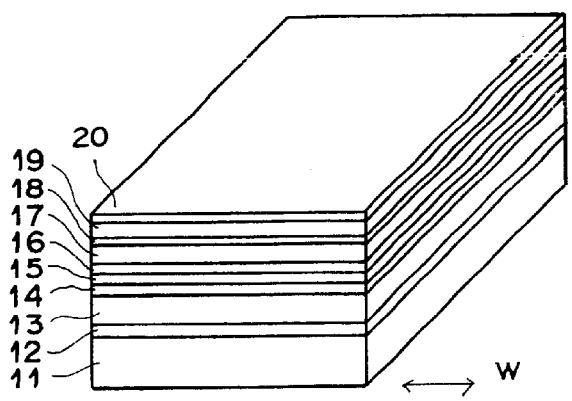
FIG. 1A is a perspective view of a first stage in a process for producing a semiconductor laser device as an embodiment of the present invention.

First, as illustrated in FIG. 1A, an n-type GaAs substrate 12, an n-type $In_{0.49}Ga_{0.51}P$ lower cladding layer 13, an n-type or i-type $In_{x3}Ga_{1-x3}As_{1-y3}P_{y3}$ lower optical waveguide layer 14 (x3=0.49y3, $0 \leq x3 \leq 0.3$), an $In_xGa_{1-x}As_{1-y}P_y$ quantum-well active layer 15 ($0 \leq x \leq 0.4$, $0 \leq y \leq 0.1$), a p-type or i-type $In_{x3}Ga_{1-x3}As_{1-y3}P_{y3}$ upper optical waveguide layer 16 (x3=0.49y3, $0 \leq x3 \leq 0.3$), a p-type $In_{0.49}Ga_{0.51}P$ first upper cladding layer 17, and a GaAs etching stop layer 18 are formed on a (100) face of an n-type GaAs substrate 11 by organometallic vapor phase epitaxy, where the n-type or i-type $In_{x3}Ga_{1-x3}As_{1-y3}P_{y3}$ lower optical waveguide layer 14 (x3=0.49y3, $0 \leq x3 \leq 0.3$), the $In_xGa_{1-x}As_{1-y}P_y$ quantum-well active layer 15 ($0 \leq x \leq 0.4$, $0 \leq y \leq 0.1$), and the p-type or i-type $In_{x3}Ga_{1-x3}As_{1-y3}P_{y3}$ upper optical waveguide layer 16 (x3=0.49y3, $0 \leq x3 \leq 0.3$) constitute an SCH (separate confinement heterostructure) layer as an active zone. Further, an n-type $In_{0.49}Ga_{0.51}P$ current confinement layer 19 and a GaAs cap layer 20 are formed on the above layers.

Figure 1B:
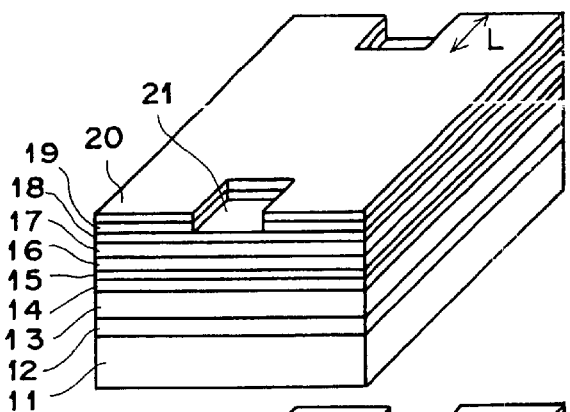
FIG. 1B is a perspective view of a second stage in the process for producing the semiconductor laser device as the embodiment of the present invention.

Next, a resist (not shown) is applied to the layers formed as above, and predetermined regions are removed by conventional lithography so as to form openings 21 as illustrated in FIG. 1B. The openings 21 have a width (W) of 3 micrometers in the direction which is perpendicular to an orientation flat of the wafer of the n-type GaAs substrate 11 and parallel to cleavage surfaces of the semiconductor laser device, and a length00 (L) of about 15 micrometers in the direction which is parallel to the orientation flat and perpendicular to the cleavage surfaces. Since, in practice, a plurality of semiconductor laser devices are concurrently manufactured on the wafer of the n-type GaAs substrate 11, and arranged side by side, openings 21 each have a width (W) of 3 micrometers in the direction which is perpendicular to the orientation flat and parallel to the cleavage surfaces and a length of about 30 micrometers in the direction which is parallel to the orientation flat and perpendicular to the cleavage surfaces are formed on the wafer. Then, the GaAs cap layer 20 is etched off with a tartaric acid etchant, the resist is removed, and the n-type In0.49Ga0.51P current confinement layer 19 is etched off with a hydrochloric acid etchant.

Figure 1C:
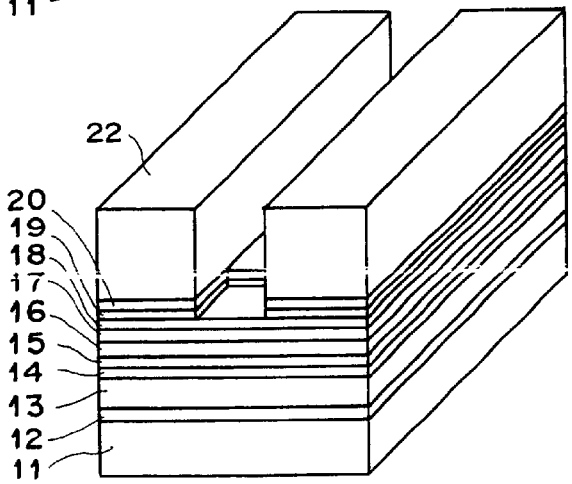
FIG. 1C is a perspective view of a third stage in the process for producing the semiconductor laser device as the embodiment of the present invention.

Thereafter, another resist 22 is applied to the layers formed as above, and a stripe region having a width of 3 micrometers and being directed in the direction parallel to the orientation flat is removed by conventional lithography so as to form a stripe groove which overlaps the above openings 21 as illustrated in FIG. 1C. Then, a stripe portion of the GaAs cap layer 20 exposed at the bottom of the stripe groove and portions of the GaAs etching stop layer 18 exposed by the formation of the above openings 21 are etched off with a tartaric acid etchant, and the resist 22 is removed.

Figure 1D:
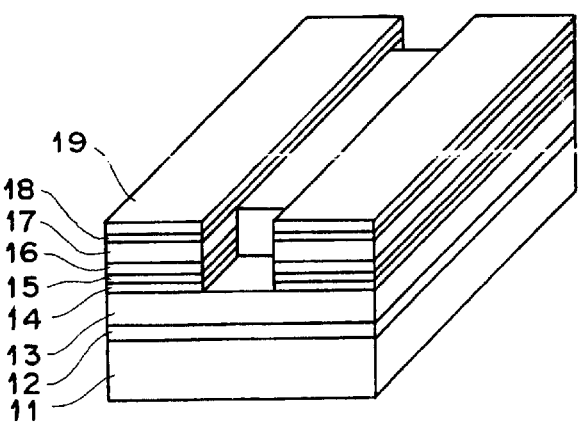
FIG. 1D is a perspective view of a fourth stage in the process for producing the semiconductor laser device as the embodiment of the present invention.

Next, as illustrated in FIG. 1D, portions of the p-type In0.49Ga0.51P first upper cladding layer 17 and a stripe portion of the n-type In0.49Ga0.51P current confinement layer 19, which are exposed by the etching of the above portions of the GaAs cap layer 20 and the GaAs etching stop layer 18, are also etched off with a hydrochloric acid etchant. Then, the remaining portions of the GaAs cap layer 20 and a stripe portion of the GaAs etching stop layer 18 exposed by the etching of the above stripe portion of the n-type In0.49Ga0.51P current confinement layer 19 are etched off with a tartaric acid etchant. At the same time, portions of the p-type or i-type $In_{x3}Ga_{1-x3}As_{1-y3}P_{y3}$ upper optical waveguide layer 16 (x3=0.49y3, $0 \leq x3 \leq 0.3$), the $In_xGa_{1-x}As_{1-y}P_y$ quantum-well active layer 15 ($0 \leq x \leq 0.4$, $0 \leq y \leq 0.1$), and the n-type or i-type $In_{x3}Ga_{1-x3}As_{1-y3}P_{y3}$ lower optical waveguide layer 14 (x3=0.49y3, $0 \leq x3 \leq 0.3$), which are located under the above openings 21, i.e., portions of the active zone under the openings 21, are also etched off.

Figure 2A:
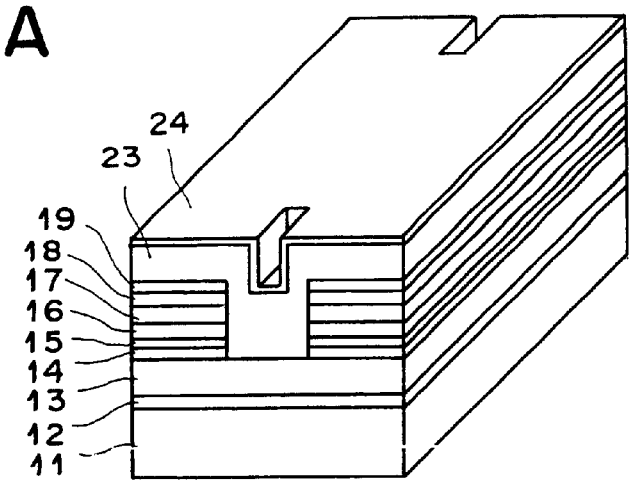
FIG. 2A is a perspective view of a fifth stage in a process for producing a semiconductor laser device as the embodiment of the present invention.

Thereafter, as illustrated in FIG. 2A, a p-type (Zn-doped) $In_{0.49}Ga_{0.51}P$ second upper cladding layer 23 and a p-type GaAs contact layer 24 are formed on the layered structure formed as above. Since the $In_{0.49}Ga_{0.51}P$ second upper cladding layer 23 is doped with Zn, Zn diffuses from the side surfaces of the openings 21 into the active layer, causes crystal mixture, and thus window structures are formed.

Figure 2B:
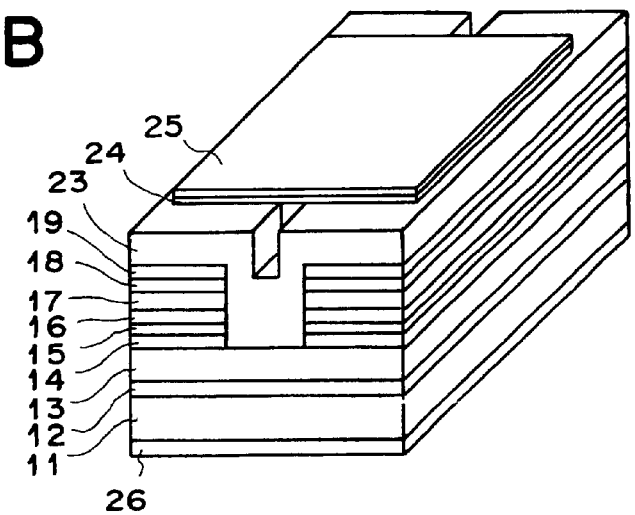
FIG. 2B is a perspective view of a sixth stage in the process for producing the semiconductor laser device as the embodiment of the present invention.
Figure 2C:
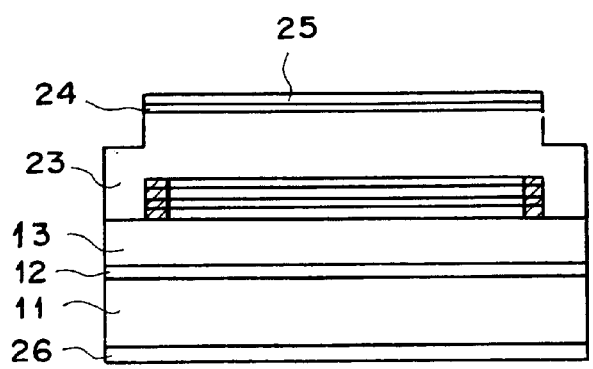
FIG. 2C is a cross-sectional view of a final stage in the process for producing the semiconductor laser device as the embodiment of the present invention.

Next, a p electrode 25 is formed by the lift-off technique on an area of the p-type GaAs contact layer 24 so as not to cover the above window structures as illustrated in FIG. 2B, and areas of the p-type GaAs contact layer 24 which are not covered by the p electrode 25 are etched off with an $NH_3:H_2O_2$ solution by using the p electrode 25 as a mask. Then, the exposed (opposite) surface of the substrate 11 is polished, and an n electrode 26 is formed on the polished surface of the substrate 11.

FIG. 2C is a cross-sectional view of the final stage in the process for producing the semiconductor laser device as the embodiment of the present invention. That is, each semiconductor laser device as the embodiment of the present invention, formed as above, has a cross section as illustrated in FIG. 2C. In each semiconductor laser device, near-edge portions of the active zone are removed, and are filled with the p-type (Zn-doped) $In_{0.49}Ga_{0.51}P$ second upper cladding layer 23. Thus, the p-type dopant, Zn, is diffused into near-edge regions of the remaining portion of the active zone as indicated by hatching in FIG. 2C, and therefore the bandgaps of the active zone are increased. Consequently, it is possible to prevent light absorption in the vicinity of the end facet, and achieve high reliability even in a high output power operation.

In the above construction, the thickness of the first upper cladding layer 17 is such that index guidance in a single fundamental mode is achieved in a waveguide formed in the center of the resonator under the stripe groove even when the output power becomes high.

Figure 3:
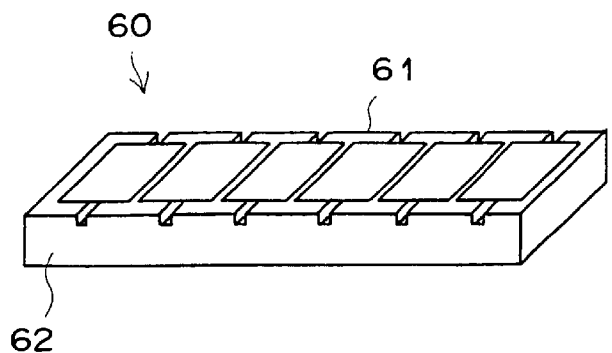
FIG. 3 is perspective view of a laser array bar including a plurality of semiconductor laser elements in the embodiment of the present invention.

After the above layered structure is formed on the wafer, the wafer is cleaved at the positions of the end facets into laser array bars 60 as illustrated in FIG. 3. Then, high-reflection coating 61 and low-reflection coating 62 are laid on the end facets of the laser array bars 60. Thereafter, the laser array bars 60 are further cleaved into chips. Thus, the semiconductor laser device as the embodiment of the present invention is obtained.

Since the active layer has a composition of $In_xGa_{1-x}As_{1-y}P_y$, the oscillation wavelengths of the semiconductor laser device as the embodiment of the present invention can be controlled in the range of 900 to 1,200 nm.

Although the n-type GaAs substrate is used in the construction of the embodiment of the present invention, instead, a p-type GaAs substrate may be used. When the GaAs substrate is a p-type, the conductivity types of all of the other layers in the construction of the embodiment should be inverted.

Each layer in the constructions of the embodiment may be formed by molecular beam epitaxy using solid or gas raw material.

The second upper cladding layer 23 may be made of $Al_{0.5}Ga_{0.5}As$, instead of $In_{0.49}Ga_{0.51}P$.

In the semiconductor laser device as the embodiment of the present invention, the GaAs etching stop layer 18 and the GaAs cap layer 20 are formed on and under the n-type $In_{0.49}Ga_{0.51}P$ current confinement layer 19. Therefore, after the near-edge regions of the GaAs cap layer 20 and the n-type $In_{0.49}Ga_{0.51}P$ current confinement layer 19 are removed by using a mask with openings having the same width as the stripe groove, the near-edge regions of the layers from the GaAs etching stop layer 18 to the n-type or i-type $In_{x3}Ga_{1-x3}As_{1-y3}P_{y3}$ lower optical waveguide layer 14 and the stripe center portions of the layers from the GaAs cap layer 20 to the GaAs etching stop layer 18 can be concurrently removed by etching in the stages of FIGS. 1C and 1D by using the mask having the stripe opening. That is, the end-facet window structure and the internal stripe can be concurrently formed, and thus the manufacturing process can be simplified.

In addition, since the end-facet window structure having the same width as the internal stripe is automatically formed in the regions adjacent to the internal stripe, the dopant Zn in the p-type $In_{0.49}Ga_{0.51}P$ second upper cladding layer 23 can diffuse into near-edge regions of the active layer with high accuracy, i.e., the end-facet window structure can be formed with high reproducibility.

Further, since the GaAs cap layer 20 is formed on the n-type $In_{0.49}Ga_{0.51}P$ current confinement layer 19, it is possible to prevent production of a metamorphic layer on the InGaP current confinement layer, or adherence of dirt to the InGaP current confinement layer, although the metamorphic change occurs when a resist layer is formed directly on the current confinement layer. In addition, the GaAs cap layer 20 can be removed together with the near-edge portions of the GaAs etching stop layer 18. Therefore, even when a metamorphic layer is produced on the InGaP current confinement layer, or dirt adheres to the InGaP current confinement layer, the metamorphic layer and the dirt can be removed by the operation of removing the GaAs cap layer 20.

Although the semiconductor laser device as the embodiment oscillates in a fundamental transverse mode, the present invention can also be applied to a broad-stripe semiconductor laser device having a stripe width of 3 micrometers or greater. In this case, it is possible to increase reliability in a further high output power range.

Furthermore, when antireflection coatings, instead of the high-reflection coating 61 and the low-reflection to coating 62, are laid on both the (cleaved) end facets, a semiconductor light emitting device in which laser oscillation does not occur can be produced.

First Example of Use

Figure 4:
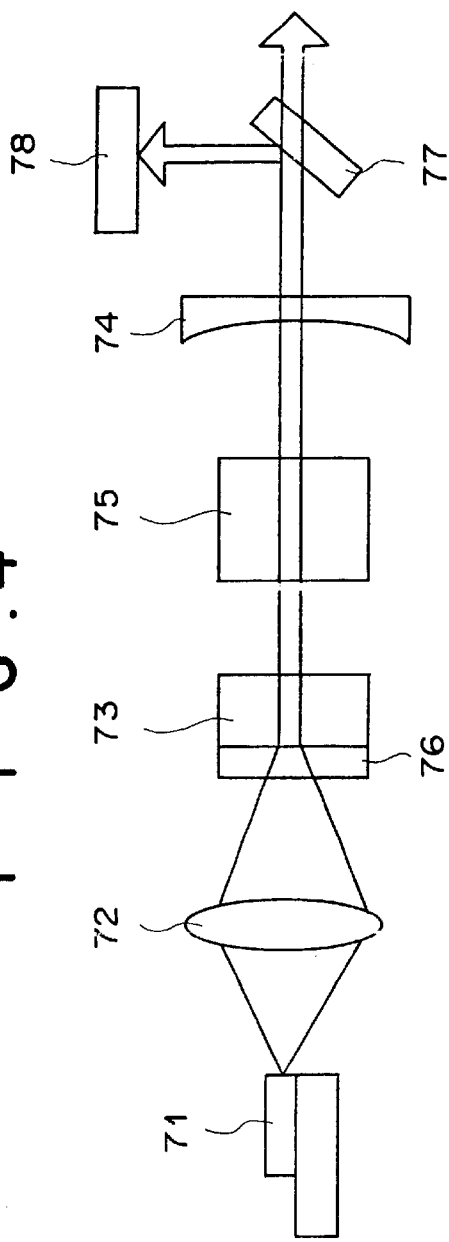
FIG. 4 is diagram illustrating a solid-state laser apparatus using as an excitation light source the semiconductor laser device as the embodiment of the present invention.

A first example of use of the semiconductor laser device as the above embodiment is explained below with reference to FIG. 4, which is a diagram illustrating an outline of a construction of a solid-state laser apparatus which generates a second harmonic. In the example of FIG. 4, the semiconductor laser device as the above embodiment is used as an excitation light source in the solid-state laser apparatus.

The solid-state laser apparatus of FIG. 4 comprises a semiconductor laser device 71, a lens 72, a solid-state laser crystal 73, an output mirror 74, a $KNbO_3$ nonlinear crystal 75, a coating film 76, a beam splitter 77, and a light receiving element 78. The semiconductor laser device 71 is the semiconductor laser device as the embodiment of the present invention, and emits single-mode light as the excitation light. The lens 72 collects the excitation light emitted from the semiconductor laser device 71. The solid-state laser crystal 73 is excited by the collected excitation laser light, and emits laser light. The output mirror 74 is realized by a concave mirror. In addition, the coating film 76 is provided on a surface of the solid-state laser crystal 73 on the side of the semiconductor laser device 71. The coating film 76 highly reflects the oscillation light of the solid-state laser crystal 73, and does not reflect the oscillation light of the semiconductor laser device 71. Thus, a resonator is realized between the output mirror 74 and the coating film 76 in the solid-state laser apparatus. Further, the $KnbO_3$ nonlinear crystal 75, which converts the oscillation light of the solid-state laser crystal 73 into a second harmonic (i.e., generates laser light having the half wavelength of the oscillation light of the solid-state laser crystal 73), is arranged in the resonator of the solid-state laser apparatus. The nonlinear crystal 75 may be made of KTP ($KTiOPO_4$) or the like, instead of $KNbO_3$. In addition, the solid-state laser crystal 73 may be made of $Nd:YVO_4$ or the like.

The temperature of the semiconductor laser device 71, the solid-state laser crystal 73, and the nonlinear crystal 75 is controlled by using a Peltier element (not shown). A portion of laser light emitted from the solid-state laser apparatus is branched off by the beam splitter 77, and led to the light receiving element 78, which detects the intensity of the branched-off portion of the laser light. The detected intensity is fed back to the semiconductor laser device 71 so that the semiconductor laser device 71 is driven under automatic power control (APC), and the intensity of the laser light emitted from the solid-state laser apparatus is maintained constant.

Since the semiconductor laser device as the embodiment of the present invention is used in the above solid-state laser apparatus, high reliability is achieved even in a high output power operation.

Second Example of Use

Figure 5:
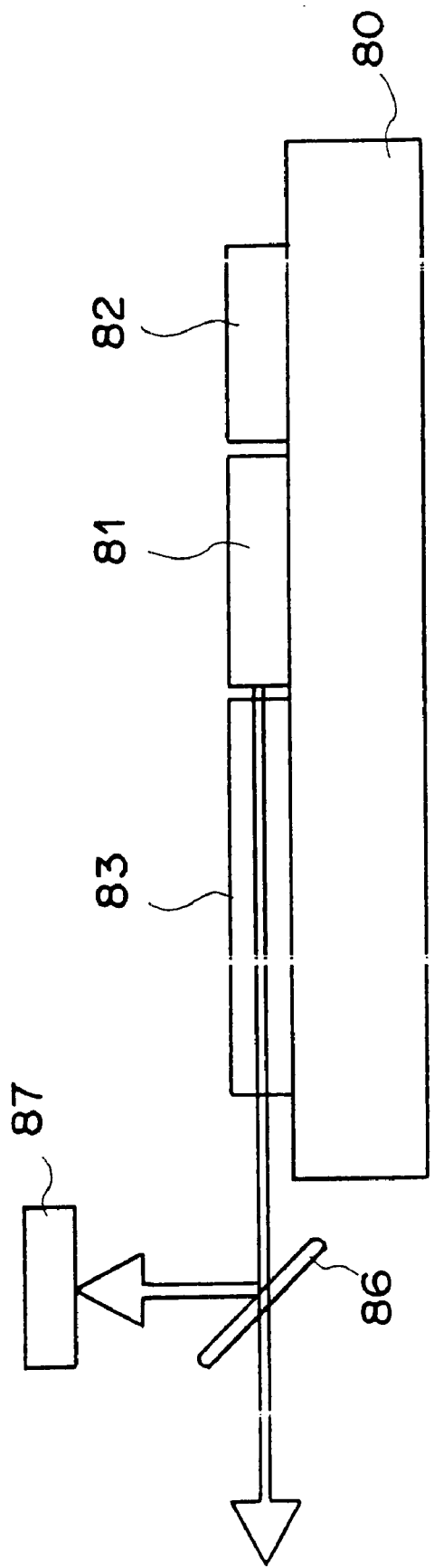
FIG. 5 is diagram illustrating another solid-state laser apparatus using as an excitation light source the semiconductor laser device as the embodiment of the present invention.

A second example of use of the semiconductor laser device as the embodiment is explained below with reference to FIG. 5, which is a diagram illustrating an outline of a construction of another solid-state laser apparatus which generates a second harmonic. In the example of FIG. 5, the semiconductor laser device as the above embodiment is also used as an excitation light source in the solid-state laser apparatus.

The laser apparatus of FIG. 5 comprises a Peltier element 80, a semiconductor laser device 81, a waveguide grating 82, a MgO-LN waveguide SHG (second harmonic generator) 83, a beam splitter 86, and a light receiving element 87. The semiconductor laser device 81 is the semiconductor laser device as the embodiment of the present invention, and emits single-mode light as the excitation light. The semiconductor laser device 81, the waveguide grating 82, and the MgO-LN waveguide SHG 83 are mounted on the Peltier element 80, and the temperature of the semiconductor laser device 81, the waveguide grating 82, and the MgO-LN waveguide SHG 83 are controlled by the Peltier element 80. In particular, the waveguide grating 82 is mounted on an identical axis with that of the semiconductor laser device 81, and independently coupled to the semiconductor laser device 81. The waveguide grating 82 locks the wavelength of the laser light emitted from the semiconductor laser device 81. The MgO-LN waveguide SHG 83 is an optical wavelength conversion element which is produced by forming an optical waveguide and a periodic domain-inverted structure on a substrate made of $LiNbO_3$ and doped with MgO. When the MgO-LN waveguide SHG 83 receives the wavelength-locked laser light emitted from the semiconductor laser device 81, and the MgO-LN waveguide SHG 83 converts the laser light of the semiconductor laser device 81 into a second harmonic (i.e., generates laser light having the half wavelength of the laser light of the semiconductor laser device 81).

Additional Matters (i) The semiconductor laser device according to the present invention can be used as a light source in arrayed semiconductor laser apparatuses, optical integrated circuits, and the like, as well as the solid-state laser apparatuses as the aforementioned first and second examples. Further, the semiconductor laser device according to the present invention can be used as a light source in the fields of high-speed information and image processing, communications, laser measurement, medicine, printing, and the like.

What is claimed is:

1. A process for producing a semiconductor light emitting device, comprising the steps of:
   (a) forming a substrate;
   (b) forming above said substrate a lower cladding layer of a first conductive type;
   (c) forming above said lower cladding layer an active zone including an active layer;
   (d) forming above said active zone an upper cladding layer of a second conductive type;
   (e) forming a current confinement layer above said upper cladding layer, and obtaining a lamination of the lower cladding layer, the active layer, the upper cladding layer, and the current confinement layer;
   (f) removing at least one first near-edge portion of said lamination being located near at least one of two opposite end facets and having a first depth and a width approximately equal to a stripe width so as to produce at least one first space, by etching said lamination with a first mask which has an opening corresponding to said first near-edge portion;
   (g) concurrently removing at least one second near-edge portion of said lamination being located near said at least one of said two opposite end facets and having said stripe width and a second depth corresponding to a bottom of said active layer or a lower elevation, and a stripe portion of said lamination being located inside said at least one first space and having said stripe width and a third depth corresponding to a bottom of said current confinement layer or a lower elevation, so as to produce a second space, by etching said lamination with a second mask which has a stripe opening having a width corresponding to said stripe width and extending from one to the other of the two opposite end facets; and
   (h) forming a regrowth layer so as to fill said at least one first space and said second space.

* * * * *